(12) United States Patent
Jeon

(10) Patent No.: US 10,403,186 B2
(45) Date of Patent: Sep. 3, 2019

(54) DISPLAY DEVICE AND METHOD OF TESTING THE SAME

(71) Applicant: Samsung Display Co., Ltd., Yongin-si, Gyeonggi-do (KR)

(72) Inventor: Hee Chul Jeon, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 220 days.

(21) Appl. No.: 15/410,605

(22) Filed: Jan. 19, 2017

(65) Prior Publication Data

US 2017/0301272 A1    Oct. 19, 2017

(30) Foreign Application Priority Data

Apr. 18, 2016    (KR) .................. 10-2016-0046799

(51) Int. Cl.
- *G01R 31/00* (2006.01)
- *G09G 3/00* (2006.01)
- *G01R 27/02* (2006.01)
- *G01R 31/04* (2006.01)
- *G09G 3/20* (2006.01)

(52) U.S. Cl.
CPC ............ *G09G 3/006* (2013.01); *G01R 27/02* (2013.01); *G01R 31/041* (2013.01); *G09G 3/20* (2013.01)

(58) Field of Classification Search
CPC .. G01R 31/26; G01R 31/041; G01R 31/2863; G01R 27/02; G09G 3/20; G09G 3/006; G09G 3/3208; G09G 3/3275; G09G 3/3266; G09G 3/3258; G09G 3/36; G09G 3/3688; G09G 2310/0297; G09G 2330/12; H01L 27/3276; H01L 27/323; H01L 27/3262; H01L 27/1244
See application file for complete search history.

(56) References Cited

U.S. PATENT DOCUMENTS

| | | | | |
|---|---|---|---|---|
| 2014/0217373 A1* | 8/2014 | Youn | ............... | H01L 23/4985 257/40 |
| 2014/0217397 A1* | 8/2014 | Kwak | ............... | H01L 27/1218 257/43 |
| 2014/0232956 A1* | 8/2014 | Kwon | ............... | G02F 1/133305 349/12 |
| 2015/0219947 A1* | 8/2015 | Moh | ............... | G02F 1/13452 349/33 |
| 2016/0379906 A1* | 12/2016 | Kim | ............... | G09G 3/3688 257/48 |
| 2017/0199439 A1* | 7/2017 | Jia | ............... | G01R 31/2621 |
| 2018/0219165 A1* | 8/2018 | Kwon | ............... | H01L 27/3276 |

FOREIGN PATENT DOCUMENTS

KR    10-2017-0113870    10/2017

* cited by examiner

*Primary Examiner* — Thang X Le
(74) *Attorney, Agent, or Firm* — F. Chau & Associates, LLC

(57) ABSTRACT

A display device and a method of testing the same are disclosed. In one aspect, the display device includes a first substrate including a display area and a non-display area arranged outside the display area. The display device also includes a bending area arranged in the non-display area, first and second signal lines arranged in the non-display area, and a first test pattern arranged between the first and second signal lines.

23 Claims, 11 Drawing Sheets

DISPLAY DEVICE AND METHOD OF TESTING THE SAME

This application claims priority to Korean Patent Application No. 10-2016-0046799 filed on Apr. 18, 2016 in the Korean Intellectual Property Office, the disclosure of which is incorporated herein by reference in its entirety.

BACKGROUND

Field

The described technology generally relates to a display device and a method of testing the same.

Description of the Related Technology

The importance of display devices has steadily grown with developments in multimedia technology. As a result, various flat panel display technologies such as a liquid crystal display (LCD), an organic light-emitting diode (OLED) display, and the like have been developed and manufactured for integration with a wide array of product categories.

The LCD, which is one of the most widely-used flat panel displays, includes two substrates on which field-generating electrodes such as pixel electrodes and a common electrode are formed and a liquid crystal layer which is interposed between the two substrates. It generates an electric field in the liquid crystal layer by applying a voltage to the field-generating electrodes, and thus displays an image based on the orientation of liquid crystal molecules in the liquid crystal layer and control of the polarization of incident light.

An OLED display generates an image by causing an organic light-emitting layer between an anode electrode and a cathode electrode to emit light.

These display devices generally have a display area in which to display an image and a peripheral area that surrounds the display area.

In the peripheral area, various signal lines are incorporated for the purpose of signal transfer from input data to the pixels. The signal lines are not properly tested at a complete product level or a partially-finished product level. Thus, the necessity of various testing devices for testing the signal lines has arisen, and various attempts at testing have been made.

SUMMARY OF CERTAIN INVENTIVE ASPECTS

One inventive aspect relates to a display device that can determine whether various signal lines in a non-display area are disconnected.

Another aspect is a display device that can easily detect defects by determining whether signal lines are disconnected by bending.

Another aspect is a display device that includes: a first substrate including a display area and a non-display area, which is disposed outside the display area; a bending area disposed in the non-display area; first and second signal lines disposed in the non-display area; and a first test pattern disposed between the first and second signal lines.

The first substrate can have flexibility.

A first bending line where the bending of the first substrate begins and a second bending line where the bending of the first substrate ends can be defined in the non-display area, and the bending area can be defined between the first and second bending lines.

The first test pattern and the first signal line can have the same strength.

The first test pattern can be formed of the same material as the first signal line.

More than one first pattern can be provided.

The display device can further include: a plurality of signal lines including the first and second signal lines; and second test patterns disposed on outer sides of two outermost signal lines of the plurality of signal lines.

The first test pattern can at least partially overlap the bending area.

A width of the bending area can be smaller than a length of the first test pattern.

The first signal line and the first test pattern can be disposed on the same layer.

The first signal line and the first test pattern can be disposed on different layers.

The first signal line and the first test pattern can at least partially overlap each other.

Each of the first and second signal lines can include first-, second-, and third-layer signal lines.

The first- and second-layer signal lines can be formed of titanium (Ti), and the second-layer signal line can be formed of aluminum (Al).

The first test pattern can include first-, second-, and third-layer test patterns.

The first- and third-layer test patterns can be formed of Ti, and the second-layer test pattern can be formed of Al.

The first test pattern can be U-shaped.

The first test pattern can include first and second sub-electrodes, which extend in one direction, and a bridge electrode, which connect the first and second sub-electrodes.

The bridge electrode can be disposed outside the bending area.

Another aspect is a method of testing a display device that includes: preparing a first substrate, which includes a display area, a non-display area that is disposed outside the display area, a bending area that is disposed in the non-display area, first and second signal lines that are disposed in the non-display area, and a first test pattern that is disposed between the first and second signal lines; and determining whether the first test pattern is disconnected.

Another aspect is a display device, comprising: a first substrate including a display area and a non-display area arranged outside the display area; a bending area arranged in the non-display area; first and second signal lines arranged in the non-display area; and a first test pattern arranged between the first and second signal lines.

In the above display device, the first substrate is flexible.

In the above display device, a first bending line and a second bending line are defined where bending of the first substrate begins and ends, wherein the bending area is defined between the first and second bending lines.

In the above display device, the first test pattern and the first signal line have substantially the same strength.

In the above display device, the first test pattern is formed of the same material as the first signal line.

In the above display device, the first test pattern includes a plurality of test patterns.

The above display device further comprises: a plurality of signal lines including the first and second signal lines; and a plurality of second test patterns arranged on outer sides of two outermost ones of the signal lines.

In the above display device, the first test pattern at least partially overlaps the bending area in the depth dimension of the display device.

In the above display device, the bending area has a width that is smaller than the length of the first test pattern.

In the above display device, the first signal line and the first test pattern are arranged on the same layer.

In the above display device, the first signal line and the first test pattern are arranged on different layers.

In the above display device, the first signal line and the first test pattern at least partially overlap each other.

In the above display device, each of the first and second signal lines includes first-, second-, and third-layer signal lines.

In the above display device, the first- and second-layer signal lines are formed of titanium (Ti), wherein the second-layer signal line is formed of aluminum (Al).

In the above display device, the first test pattern includes first-, second-, and third-layer test patterns.

In the above display device, the first- and third-layer test patterns are formed of Ti, wherein the second-layer test pattern is formed of Al.

In the above display device, the first test pattern is U-shaped.

In the above display device, the first test pattern includes first and second sub-electrodes, which extend in one direction, and a bridge electrode, which connect the first and second sub-electrodes.

In the above display device, the bridge electrode is arranged outside the bending area.

In the above display device, a portion of the bridge electrode is arranged outside the bending area.

Another aspect is a method of testing a display device, comprising: preparing a first substrate, which includes a display area and a non-display area arranged outside the display area, wherein the non-display area includes a bending area, first and second signal lines, and a test pattern that is arranged between the first and second signal lines; and determining whether the test pattern is disconnected.

In the above method, the determining includes i) connecting the test pattern to a testing device and ii) comparing an input resistance with the resistance of the test pattern.

The above method further comprises determining that i) the first and/or second signal line is disconnected when the test pattern is disconnected or ii) the first and/or second signal line is connected when the test pattern is connected.

According to at least one of the disclosed embodiments, it is possible to easily determine whether signals are disconnected.

In addition, it is possible to easily detect defects by determining whether signal lines are disconnected by bending.

DETAILED DESCRIPTION OF CERTAIN INVENTIVE EMBODIMENTS

Figure 1:
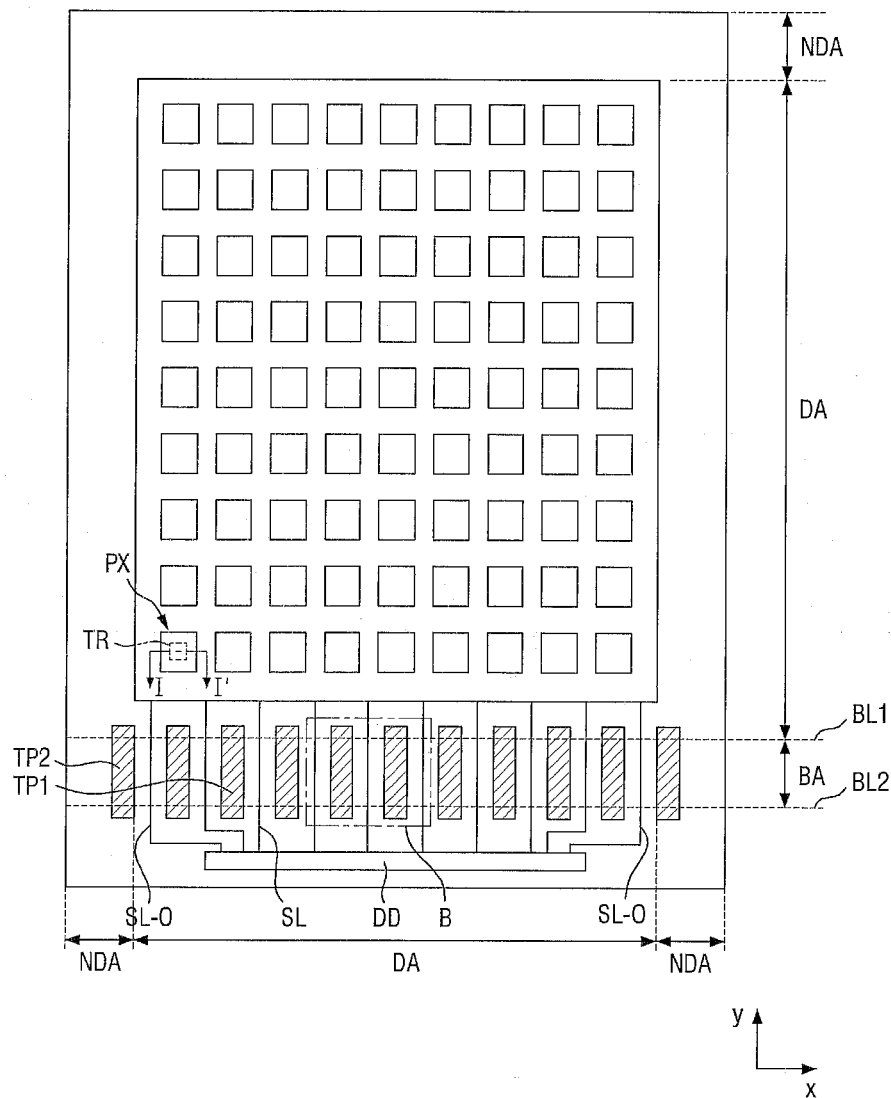
FIG. 1 is a layout view of a display device according to an exemplary embodiment of the present disclosure.

The aspects and features of the described technology and methods for achieving the aspects and features will be apparent by referring to the embodiments to be described in detail with reference to the accompanying drawings. However, the described technology is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the described technology, and the described technology is only defined within the scope of the appended claims.

In the entire description of the described technology, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element can be a second constituent element.

Hereinafter, embodiments of the described technology will be described with reference to the attached drawings. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
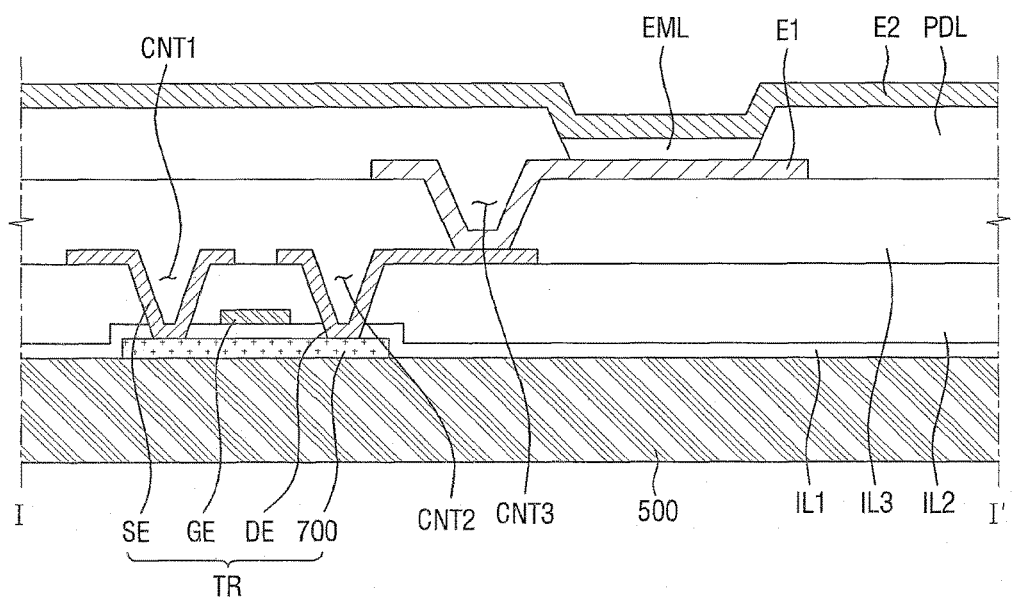
FIG. 2 is a cross-sectional view taken along line I-I' of FIG. 1.
Figure 3:
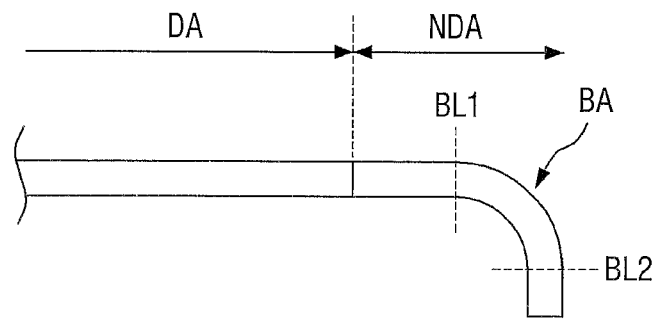
FIG. 3 is a side view of the display device according to the exemplary embodiment of FIG. 1.
Figure 4:
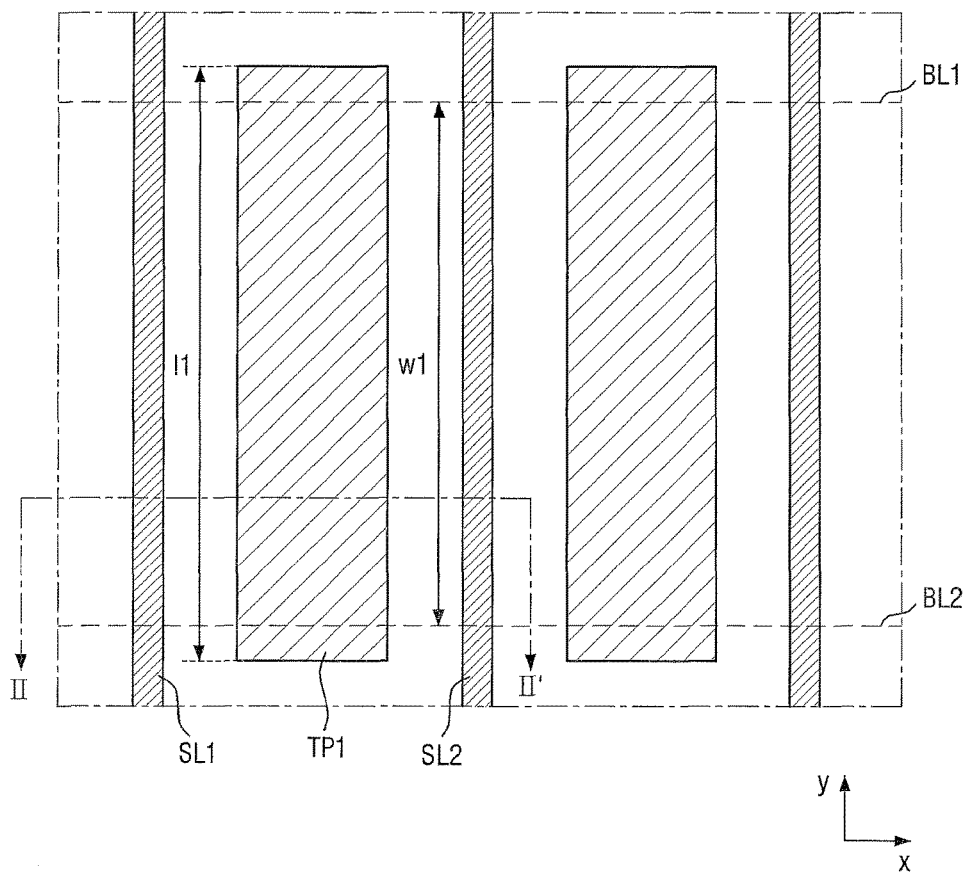
FIG. 4 is an enlarged view of an area B of FIG. 1.
Figure 5:
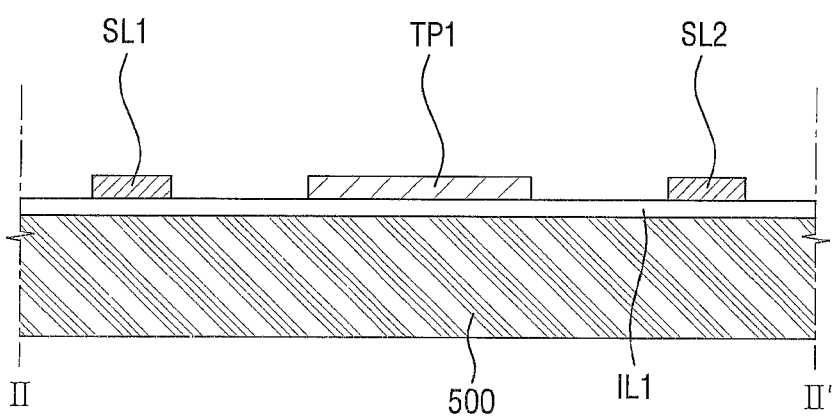
FIG. 5 is a cross-sectional view taken along line II-II' of FIG. 4.

FIG. 1 is a layout view of a display device according to an exemplary embodiment of the present disclosure. FIG. 2 is a cross-sectional view taken along line I-I' of FIG. 1. FIG. 3 is a side view of the display device according to the exemplary embodiment of FIG. 1. FIG. 4 is an enlarged view of an area B of FIG. 1. FIG. 5 is a cross-sectional view taken along line II-II' of FIG. 4.

Referring to FIGS. 1 through 5, the display device includes a first substrate 500, which has a display area DA, a non-display area NDA that is disposed outside the display area DA, and a bending area BA, which is disposed in the non-display area NDA. The display device also includes first and second signal lines SL_1 and SL_2, which are disposed in the non-display area NDA, and a first test pattern TP1, which is disposed between the first and second signal lines SL_1 and SL_2.

The first substrate 500 can be formed of a material with heat resistance and transparency. The first substrate 500 can be formed of, for example, transparent glass or plastic, but the present disclosure is not limited thereto.

The first substrate 500 can be formed of a flexible material. For example, the first substrate 500 can have flexibility. The first substrate 500 can be formed of, for example, polyimide (PI). However, the material of the first substrate 500 is not particularly limited, and any material that can impart flexibility to the first substrate 500 can be used to form the first substrate 500.

The first substrate 500 can include the display area DA and the non-display area NDA. The display area DA is an area in which an image is displayed, and a plurality of pixels PX can be disposed in the display area DA. FIG. 1 illustrates an example in which the pixels PX are arranged in a matrix of rows and columns, but the arrangement of the pixels PX is not limited to this example. The pixels PX can emit light of various colors. For example, each of every three adjacent pixels emits light of at least one of three colors, e.g., red, green, and blue, and the arrangement of the three colors is not particularly limited. For example, the pixels PX are arranged such that at least two of the three colors are alternately arranged along an x-axis direction or a y-axis direction, but the arrangement of red, green, and blue is not limited to this example.

Each of the pixels PX can include at least one transistor TR. The structure of the pixels PX will be described later in detail with reference to FIG. 2.

The non-display area NDA can be disposed outside the display area DA. For example, the non-display area NDA can be disposed to surround the circumference of the display area DA. In a case in which the display area DA is rectangular, the non-display area NDA can be in the shape of a rectangle with a hollow center. FIG. 1 illustrates an example in which the display area DA is substantially rectangular, but the shape of the display area DA is not limited to this example. For example, in another example, the display area DA is polygonal or partially curved.

A plurality of signal lines SL for driving the display area DA can be disposed in the non-display area NDA.

In an exemplary embodiment, the signal lines SL are data fan-out lines. For example, first ends of the signal lines SL are connected to a data driver DD, which is disposed in the non-display area NDA, and second ends of the signal lines SL can be connected to the display area DA. In an exemplary embodiment, the signal lines SL are connected to data lines (not illustrated) in the display area DA. For example, the signal lines SL receive signals generated by the data driver DD and provide the received signals to the data lines in the display area DA. The pixels PX, which are disposed in the display area DA, can be driven by the signals provided by the signal lines SL, and as a result, a desired image can be displayed in the display area DA.

The bending area BA can be defined in the non-display area NDA. The bending area BA can be formed by bending at least part of the first substrate 500. For example, the display device according to the present exemplary embodiment includes the bending area BA, which is temporarily or variably bent, or permanently bent.

In an exemplary embodiment, the first substrate 500 is temporarily or variably bent or unbent, depending on the material thereof. In another exemplary embodiment, the first substrate 500 has a permanently bent portion, in which case, the material of the first substrate 500 is not necessarily be flexible.

For example, the bending area BA is defined as part of the first substrate 500 that is not flat but bent. The bending area BA can be disposed between two bending lines BL. For example, the bending lines BL are defined as lines at which the bending of the first substrate 500 begins and ends, respectively. For example, the bending of the first substrate 500 begins at a first bending line BL1 and ends at a second bending line BL2. For example, the first substrate 500 is flat on the outer sides of the first and second bending lines BL1 and BL2 and can be curved on the inner sides of the first and second bending lines BL1 and BL2, e.g., between the first and second bending lines BL1 and BL2.

Due to the aforementioned characteristics, the bending area BA can extend from the non-display area NDA in the x-axis direction.

One or more first test patterns TP1 can be disposed between every two adjacent signal lines SL. The first test patterns TP1 can be disposed to overlap the bending area BA. FIG. 1 illustrates an example in which one first test pattern TP1 is disposed between every two adjacent signal lines SL, but the present disclosure is not limited to this example. For example, more than one first test pattern TP1 are disposed between every two adjacent signal lines SL. This will be described later in detail with reference to FIG. 4.

The first test patterns TP1 can comprise a metal material having conductivity. For example, the first test patterns TP1 have a single- or multilayer structure formed of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), or tantalum (Ta). Alternatively, the first test patterns TP1 can be formed of an alloy of the metal material and at least one element selected from the group consisting of Ti, zirconium (Zr), tungsten (W), Ta, Nb, platinum (Pt), hafnium (Hf), oxygen (O), and nitrogen (N).

In an exemplary embodiment, the strength of the first test patterns TP1 is the substantially same as the strength of the signal lines SL. For example, as will be described later, stress is applied to the first test patterns TP1 and the signal lines SL, and the resistance of the first test patterns TP1 against the stress can be substantially the same as the resistance of the signal lines SL against the stress. The first test patterns TP1 and the signal lines SL can be formed of the same material.

However, the material of the first test patterns TP1 and the signal lines SL is not particularly limited. For example, in another exemplary embodiment, the first test patterns TP1 and the signal lines SL are formed of different materials and have the same or similar strengths.

The first test patterns TP1 and the signal lines SL can be formed to have the same or similar strengths to determine whether the signal lines SL are disconnected based on whether the first test patterns TP1 are disconnected. For example, it can often be difficult to detect whether the signal lines SL are disconnected because of some structural and design reasons, in which case, it can be determined whether the signal lines SL are disconnected by inspecting the first test patterns TP1 for any disconnections.

In an exemplary embodiment, a plurality of first test patterns TP1 is provided. The first test patterns TP1 can be disposed among the signal lines SL. For example, as illustrated in FIG. 1, the first test patterns TP1 can be sequentially disposed in the non-display area NDA along the x-axis direction, but the present disclosure is not limited thereto. Alternatively, the first test patterns TP1 can be disposed along the y-axis direction.

In an exemplary embodiment, second test patterns TP2 are disposed. The second test patterns TP2 can be disposed on the outer sides of two outermost signal lines SL (hereinafter referred to as the outermost signal lines SL-O) of the signal lines SL. The second test patterns TP2, like the first test patterns TP1, can be disposed to overlap the bending area BA.

In a case in which the first substrate 500 includes the bending area BA, stress can be generated in response to the first substrate 500 being bent, and as a result, at least some of the signal lines SL overlapping the bending area BA can be disconnected due to the stress. If some of the signal lines SL are disconnected, some of the pixels PX in the display area DA may not properly operate, thereby causing display defects. However, since the signal lines SL are not exposed, it can be difficult to directly inspect the signal lines SL at a complete-product- or half-finished-product-level.

Thus, as an indirect way of inspecting the signal lines SL, the first test patterns TP1, which have substantially the same strength as, or a similar strength to, the signal lines SL, can be disposed adjacent to the signal lines SL and can be inspected for any disconnections so as to determine whether the signal line SL are disconnected.

For example, the first test patterns TP1 are disposed among the signal lines SL, and thus, it can be precisely determined whether the signal lines SL, which are disposed among the first test patterns TP1, are disconnected. On the other hand, the second test patterns TP2 are disposed on the outer sides of the outermost signal lines SL-O, and thus, it can be approximately determined whether the signal lines SL in the bending area BA are disconnected. For example, in a case in which the first test patterns TP1 and the second test patterns TP2 coexist, the first test patterns TP1 and/or the second test patterns TP2 can be tested selectively or collectively, thereby making it possible to precisely determine whether the signal lines SL are properly connected.

The display area DA will hereinafter be described with reference to FIG. 2. As described above, the pixels PX can be disposed in the display area DA. The structure of the pixels PX will hereinafter be described, taking a single pixel PX as an example.

A semiconductor pattern layer 700 can be disposed on the first substrate 500. The semiconductor pattern layer 700 can be formed of amorphous silicon or crystalline silicon. In an exemplary embodiment, the semiconductor pattern layer 700 is formed of an oxide semiconductor.

In a case in which the semiconductor pattern layer 700 is formed of an oxide semiconductor, the semiconductor pattern layer 700 can be formed of zinc oxide (ZnO). The top of the semiconductor pattern layer 700 can be doped with at least one selected from the group consisting of gallium (Ga), indium (In), stannum (Sn), Zr, Hf, cadmium (Cd), Ag, Cu, germanium (Ge), gadolinium (Gd), Ti, and vanadium (V) ions. For example, the semiconductor pattern layer 700 can comprise at least one selected from the group consisting of ZnO, ZnGaO, ZnInO, ZnSnO, GaInZnO, CdO, InO, GaO, SnO, AgO, CuO, GeO, GdO, HfO, TiZnO, InGaZnO, and InTiZnO, but the present disclosure is not limited thereto. For example, the type of the oxide semiconductor of the semiconductor pattern layer 700 is not particularly limited.

A first insulating layer IL1 can be disposed on the semiconductor pattern layer 700. The first insulating layer IL1 can be formed by mixing at least one selected from the group consisting of an inorganic insulating material such as silicon oxide (SiOx) or silicon nitride (SiNx) and an organic insulating material such as benzocyclobutene (BCB), an acrylic material, or PI.

A gate electrode GE can be disposed on the first insulating layer ILL The gate electrode GE can be disposed to overlap the semiconductor pattern layer 700.

A second insulating layer IL2 can be disposed on the gate electrode GE. The second insulating layer IL2 can be formed by mixing at least one selected from the group consisting of an inorganic insulating material such as SiOx or SiNx and an organic insulating material such as BCB, an acrylic material, or PI.

First and second contact holes CNT1 and CNT2, which partially expose the semiconductor pattern layer 700, can be disposed in the first and second insulating layers IL1 and IL2. For example, the first and second contact holes CNT1 and CNT2 can penetrate the first and second insulating layers IL1 and IL2 to expose the top surface of the semiconductor pattern layer 700.

A source electrode SE and a drain electrode DE can be disposed on the second insulating layer IL2. The source electrode SE can be connected to a data line (not illustrated) and can receive a data signal.

The source electrode SE can contact the semiconductor pattern layer 700 via the first contact hole CTN1.

The drain electrode DE can be spaced apart from the source electrode SE by a predetermined distance. The drain electrode DE can contact the semiconductor pattern layer 700 via the second contact hole CNT2.

The semiconductor pattern layer 700, the gate electrode GE, the source electrode SE, and the drain electrode DE can form the TFT TR.

A third insulating layer IL3 can be disposed on the source electrode SE and the drain electrode DE. The third insulating layer IL3 can be formed by mixing at least one selected from the group consisting of an inorganic insulating material such as SiOx or SiNx and an organic insulating material such as BCB, an acrylic material, or PI.

A third contact hole CNT3 can be disposed in the third insulating layer IL3. The third contact hole CNT3 can penetrate the third insulating layer IL3 to expose the drain electrode DE. A first electrode E1 can be disposed on the drain electrode DE. In an exemplary embodiment, the first electrode E1 is an anode electrode.

In an exemplary embodiment, the first electrode E1 is a transparent electrode. In a case in which the first electrode E1 is a transparent electrode, the first electrode E1 can be formed of indium tin oxide (ITO) or indium zinc oxide (IZO).

A pixel-defining layer PDL can be disposed on the first electrode E1 to partially expose the first electrode E1. The pixel-defining layer PDL can partially expose the first electrode E1 and can provide space for an organic light-emitting layer EML that will be described later.

The organic light-emitting layer EML can be disposed on the pixel-defining layer PDL. The organic light-emitting layer EML can be formed of organic material layers such as, for example, an emission layer (EML), a hole injection layer (HIL), a hole transport layer (HTL), an electron injection layer (EIL), and an electron transport layer (ETL). The organic light-emitting layer EML can have a single-layer structure consisting of one of the organic material layers or can have a multilayer structure consisting of two or more of the organic material layers.

A second electrode E2 can be disposed on the organic light-emitting layer EML. In an exemplary embodiment, the second electrode E2 is a full-surface electrode covering the organic light-emitting layer EML and the pixel-defining layer PDL. In the exemplary embodiment where the first electrode E1 is an anode electrode, the second electrode E2 is a cathode electrode.

FIG. 2 illustrates an example in which the display device is an organic light-emitting diode (OLED) display, but the present disclosure is not limited to this example. For example, in another example, the display device can be a liquid crystal display (LCD).

FIG. 2 also illustrates an example in which one TFT TR is disposed in each of the pixels PX, but the number of TFTs TR disposed in each of the pixels PX is not particularly limited. For example, in another example, two or more TFTs TR having the same or different functions can be disposed in each of the pixels PX.

FIG. 2 also illustrates an example in which the TFT TR includes a single gate electrode GE, but the present disclosure is not limited to this example. For example, in another example, the TFT TR includes two or more gate electrodes GE.

A side of the display device according to the present exemplary embodiment will hereinafter be described with reference to FIG. 3.

As mentioned above, the first substrate 500 can be temporarily or variably bent or unbent. The bending area BA can be defined as part of the first substrate 500 that is not flat but bent. The bending area BA can be disposed between two bending lines BL. For example, the bending lines BL are defined as lines at which the bending of the first substrate 500 begins and ends, respectively. For example, the bending of the first substrate 500 begins at the first bending line BL1 and ends at the second bending line BL2. For example, the first substrate 500 can be flat on the outer sides of the first and second bending lines BL1 and BL2 and can be curved on the inner sides of the first and second bending lines BL1 and BL2, e.g., between the first and second bending lines BL1 and BL2.

Due to the presence of the bending area BA, the normal direction of the plane on one side of the bending area BA can differ from the normal direction of the plane on the other side of the bending area BA.

FIG. 3 illustrates an example in which the angle that the normal direction of the plane on one side of the bending area BA forms with the normal direction of the plane on the other side of the bending area BA is close to about 90 degrees, but the present disclosure is not limited to this example. For example, in another example, the angle that the normal direction of the plane on one side of the bending area BA forms with the normal direction of the plane on the other side of the bending area BA can be an acute angle or an obtuse angle. For example, the angle that the normal direction of the plane on one side of the bending area BA forms with the normal direction of the plane on the other side of the bending area BA varies depending on the degree to which the first substrate 500 is bent in the bending area BA.

Referring to FIG. 4, the first test patterns TP1 are disposed among the signal line SL. For convenience, one of the signal lines SL will hereinafter be referred to as the first signal line SL1, and the signal line next to the first signal line SL1 will hereinafter be referred to as the second signal line SL2.

The first and second signal lines SL1 and SL2 can extend in a lengthwise direction. In FIG. 4, the lengthwise direction is the y-axis direction.

A first test pattern TP1 can be disposed between the first and second signal lines SL1 and SL2. The first test pattern TP1 can be spaced apart from the first and second signal lines SL1 and SL2. The first test pattern TP1 can extend in the lengthwise direction of the first and second signal lines SL1 and SL2. For example, the first test pattern TP1 and the first and second signal lines SL1 and SL2 can be in parallel to one another.

The first test pattern TP1 can overlap the bending area BA. In an exemplary embodiment, a length l1 of the first test pattern TP1 is greater than a width w1 of the bending area BA. In a case in which the length l1 of the first test pattern TP1 is greater than the width w1 of the bending area BA, the first test pattern TP1 can fully receive the stress generated by the bending of the first substrate 500. For example, the first test pattern TP1 can fully receive the force applied to the first and second signal lines SL in the bending area BA. Thus, the precision of a test using the first test pattern TP1 can be improved.

First and second ends of the first test pattern TP1 can be disposed outside the bending area BA. For example, the first end of the first test pattern TP1 is disposed on the outer side of the first bending line BL1, and the second end of the first test pattern TP1 is disposed on the outer side of the second bending line BL2. For example, the first and second ends of the first test pattern TP1 are disposed not on the inside, but on the outside, of the bending area BA.

If the first and second ends of the first test pattern TP1 are disposed outside the bending area BA, the stress applied to the bending area BA can be fully transmitted to the first test pattern TP1. Thus, the precision of a test using the first test pattern TP1 can be improved.

Referring to FIG. 5, the first and second signal line SL1 and SL2 and the first test pattern TP1 can be disposed on the same layer.

For example, a first insulating layer IL1 is disposed on the first substrate 500. In an exemplary embodiment, the first insulating layer IL1 of FIG. 5 is the same as the first insulating layer IL1 in the display area DA. For example, the first insulating layer IL1 of FIG. 5 and the first insulating layer IL1 in the display area DA are formed at the same time by the same process, but the present disclosure is not limited thereto. For example, the first insulating layer IL1 of FIG. 5 and the first insulating layer IL1 in the display area DA are formed independently of each other.

The first and second signal lines SL1 and SL2 and the first test pattern TP1 can be disposed on the first insulating layer IL1. As mentioned above, the first test pattern TP1 can be disposed between the first and second signal lines SL1 and SL2.

Display devices according to other exemplary embodiments of the present disclosure will hereinafter be described with reference to FIGS. 6 through 10. In FIGS. 1 through 10, like reference numerals indicate like elements, and thus, descriptions thereof will be omitted or at least simplified.

Figure 6:
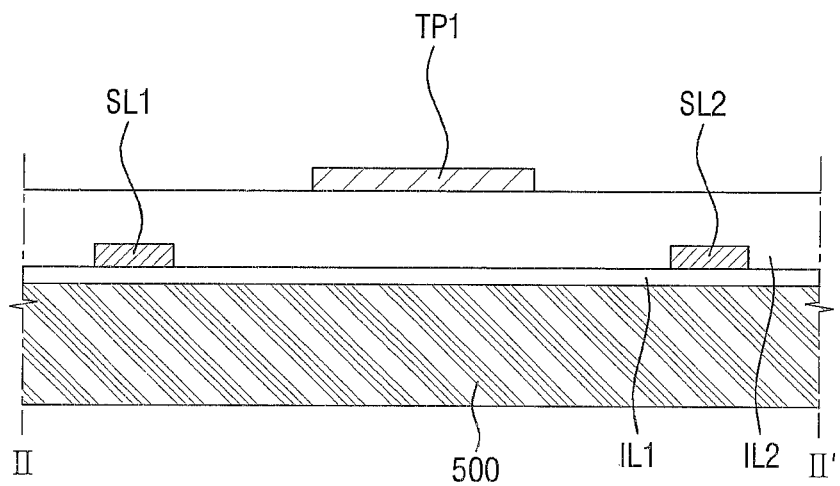
FIG. 6 is a cross-sectional view of a display device according to another exemplary embodiment of the present disclosure.

FIG. 6 is a cross-sectional view of a display device according to another exemplary embodiment of the present disclosure.

Referring to FIG. 6, the display device differs from the display device of FIG. 5 in that first and second signal lines SL1 and SL2 are disposed on a different layer from a first test pattern TP1.

In an exemplary embodiment, the first and second signal lines SL1 and SL2 are disposed on a different layer from the first test pattern TP1. For example, a first insulating layer IL1 is disposed on a first substrate 500, and the first and second signal lines SL1 and SL2 are disposed on the first insulating layer IL1.

A second insulating layer IL2 can be disposed on the first insulating layer IL1 and the first and second signal lines SL1 and SL2 to cover the first insulating layer IL1 and the first and second signal lines SL1 and SL2. FIG. 6 illustrates an example in which the second insulating layer IL2 has a single-layer structure, but the present disclosure is not limited to this example. For example, the second insulating layer IL2 has a multilayer structure consisting of two or more layers.

The first test pattern TP1 can be disposed on the second insulating layer IL2. FIG. 6 illustrates an example in which the first test pattern TP1 does not overlap the first and second signal lines TP1 and TP2, but the present disclosure is not limited thereto. For example, the first test pattern TP1 is at least partially overlap the first signal line TP1 and/or the second signal line TP2.

Figure 7:
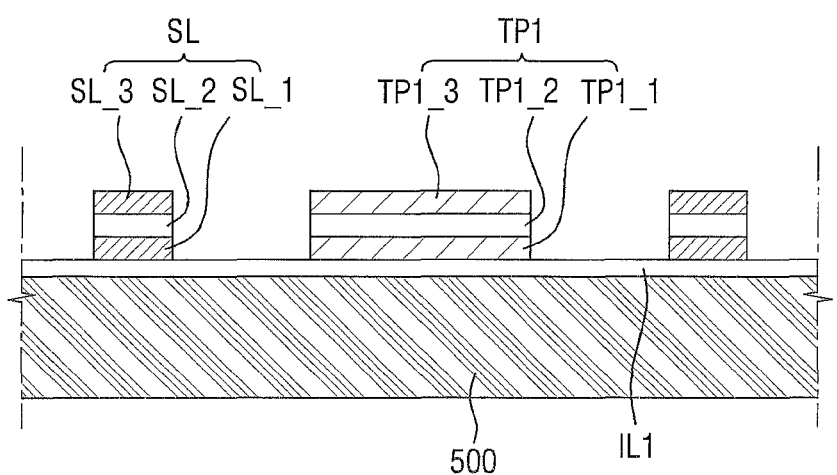
FIG. 7 is a cross-sectional view of a display device according to another exemplary embodiment of the present disclosure.

FIG. 7 is a cross-sectional view of a display device according to another exemplary embodiment of the present disclosure.

Referring to FIG. 7, the display device differs from the display device of FIG. 5 in that signal lines SL and a first test pattern TP1 have a multilayer structure.

In an exemplary embodiment, the signal lines SL and the first test pattern TP1 can have a multilayer structure consisting of two or more layers.

For example, each of the signal lines SL can include first-, second-, and third-layer signal lines SL_1, SL_2, and SL_3. The first-, second-, and third-layer signal lines SL_1, SL_2, and SL_3 can be disposed to overlap with one another. The first-, second-, and third-layer signal lines SL_1, SL_2, and SL_3 can be aligned with one another on the sides thereof. The first-, second-, and third-layer signal lines SL_1, SL_2, and SL_3 can be formed by etching three layers at the same time in a single etching process, but the present disclosure is not limited thereto.

In an exemplary embodiment, the first-, second-, and third-layer signal lines SL_1, SL_2, and SL_3 can be formed of different materials. In another exemplary embodiment, the first- and third-layer signal lines SL_1 and SL_3 can be formed of the same material, and the second-layer signal line SL_2 can be formed of a different material from the first- and third-layer signal lines SL_1 and SL_3. For example, the first- and third-layer signal lines SL_1 and SL_3 can comprise Ti, and the second-layer signal line SL_2 can comprise Al.

In a case in which the signal lines SL have a multilayer structure, the first test pattern TP1 can also have a multilayer structure. For example, the first test pattern TP1 can include first-, second-, and third-layer test patterns TP1_1, TP1_2, and TP1_3, which overlap with one another.

As described above, in an exemplary embodiment, the first test pattern TP1 can be formed of the same material as the signal lines SL. For example, the first test pattern TP1 can be formed of the same material as the signal lines SL to have substantially the same strength as, or a similar strength to, the signal line SL. In the exemplary embodiment where the first- and third-layer signal lines SL_1 and SL_3 comprise Ti and the second-layer signal line SL_2 comprises Al, the first- and third-layer test patterns TP1_1 and TP1_3 can comprise Ti, and the second-layer test pattern TP1_2 can comprise Al.

Figure 8:
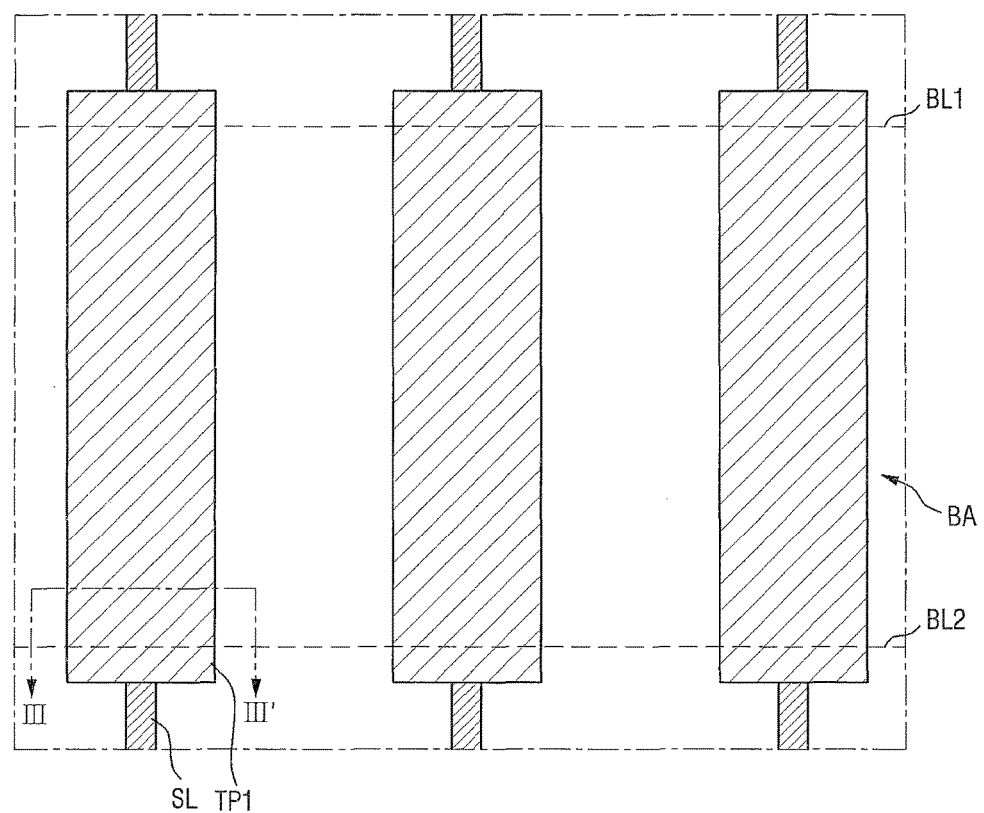
FIG. 8 is a partial plan view of a display device according to another exemplary embodiment of the present disclosure.
Figure 9:
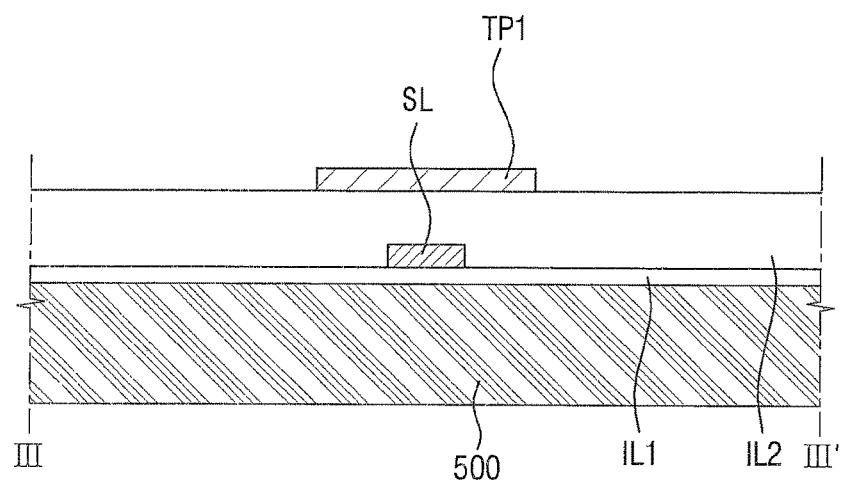
FIG. 9 is a cross-sectional view taken along line III-III' of FIG. 8.

FIG. 8 is a partial plan view of a display device according to another exemplary embodiment of the present disclosure. FIG. 9 is a cross-sectional view taken along line III-III' of FIG. 8.

Referring to FIGS. 8 and 9, the display device differs from the display device of FIG. 4 in that first test patterns TP1 overlap signal lines SL, respectively.

The first test patterns TP1 can fully overlap the signal lines SL, respectively.

The width of the first test patterns TP1 can be larger than the width of the signal lines SL, in which case, the first test patterns TP1 can fully cover the signal lines SL, respectively.

However, the present disclosure is not limited to the first test patterns TP1 fully covering the signal lines SL, respectively. For example, the first test patterns TP1 can partially cover the signal lines SL, respectively. In the exemplary embodiment of FIGS. 8 and 9, like in the exemplary embodiment of FIG. 4, both ends of each of the first test patterns TP1 can be disposed outside a bending area BA, thereby offering the same benefits as in the exemplary embodiment of FIG. 4.

Even in a case in which the first test patterns TP1 overlap the signal lines SL, respectively, the first test patterns TP1 and the signal lines SL can be insulated from each other. For example, as illustrated in FIG. 9, insulating layers can be interposed between the first test patterns TP1, respectively, and the signal lines SL, respectively. FIG. 9 illustrates an example in which the insulating layers are interposed between the first test patterns TP1, respectively, and the signal lines SL, respectively, but the present disclosure is not limited to this example. For example, any layers that can electrically insulate the first test patterns TP1 from the signal lines SL can be used.

Figure 10:
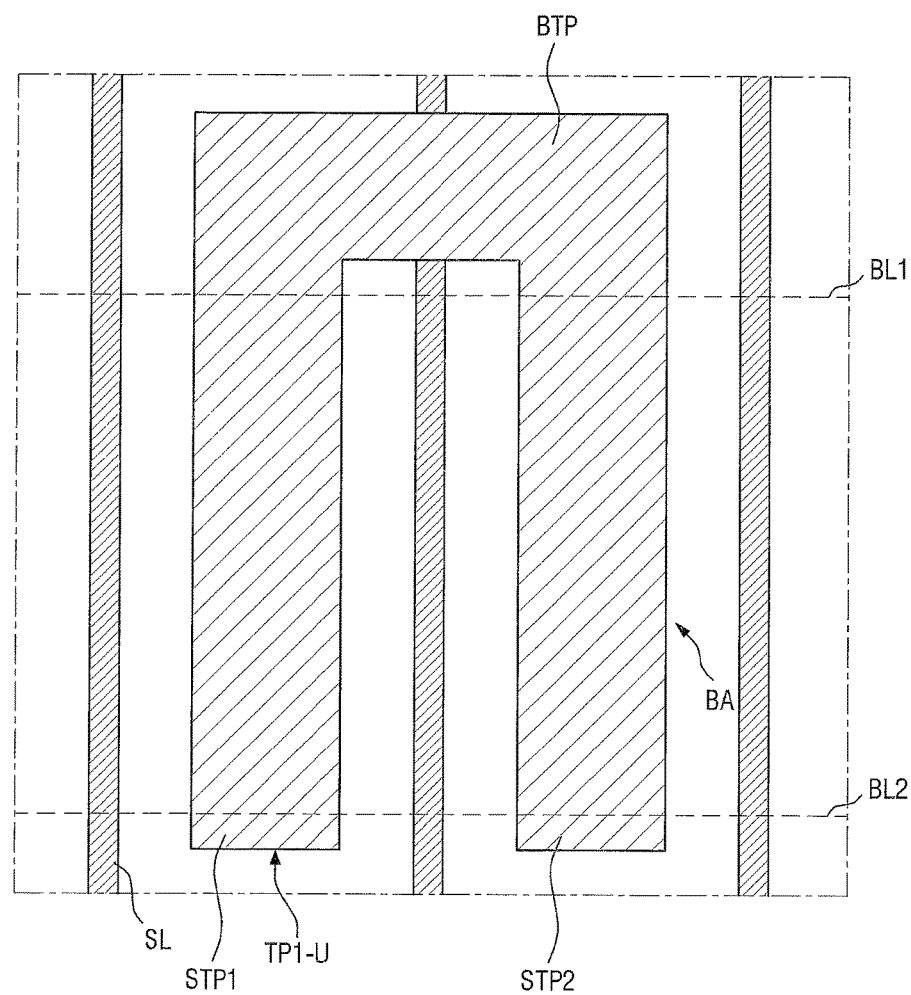
FIG. 10 is a plan view of a display device according to another exemplary embodiment of the present disclosure.

FIG. 10 is a plan view of a display device according to another exemplary embodiment of the present disclosure.

Referring to FIG. 10, the display device differs from the display device of FIG. 4 in that a first test pattern TP1_U, which is U-shaped, is provided.

In an exemplary embodiment, the first test pattern TP1_U is horse shoe- or U-shaped. For example, the first test pattern TP1 includes first and second sub-electrodes STP1, which extend in a y-axis direction, and a bridge electrode BTP, which connect the first and second sub-electrodes STP1 and SPT2.

The first and second sub-electrodes STP1 and STP2 and the bridge electrode BTP are described herein as if they were separate elements, but can simply be parts of the same first test pattern TP1_U and can be integrally formed of the same material.

The bridge electrode BTP can be disposed outside a bending area BA. For example, the bridge electrode BTP may not overlap the bending area BA.

In an exemplary embodiment, the bridge electrode BTP is disposed between the bending area BA and a display area DA, as illustrated in FIG. 10, but the present disclosure is not limited thereto. For example, the bridge electrode BTP can be disposed between the bending area BA and a non-display area NDA to electrically connect the first and second sub-electrodes STP1 and STP2.

In a case in which the first test pattern TP1_U is formed in a U-shape, the contact between the first test pattern TP1_U and a testing device can be facilitated. For example, routes for the contact between the first test pattern TP1_u and the testing device are diverse.

Figure 11:
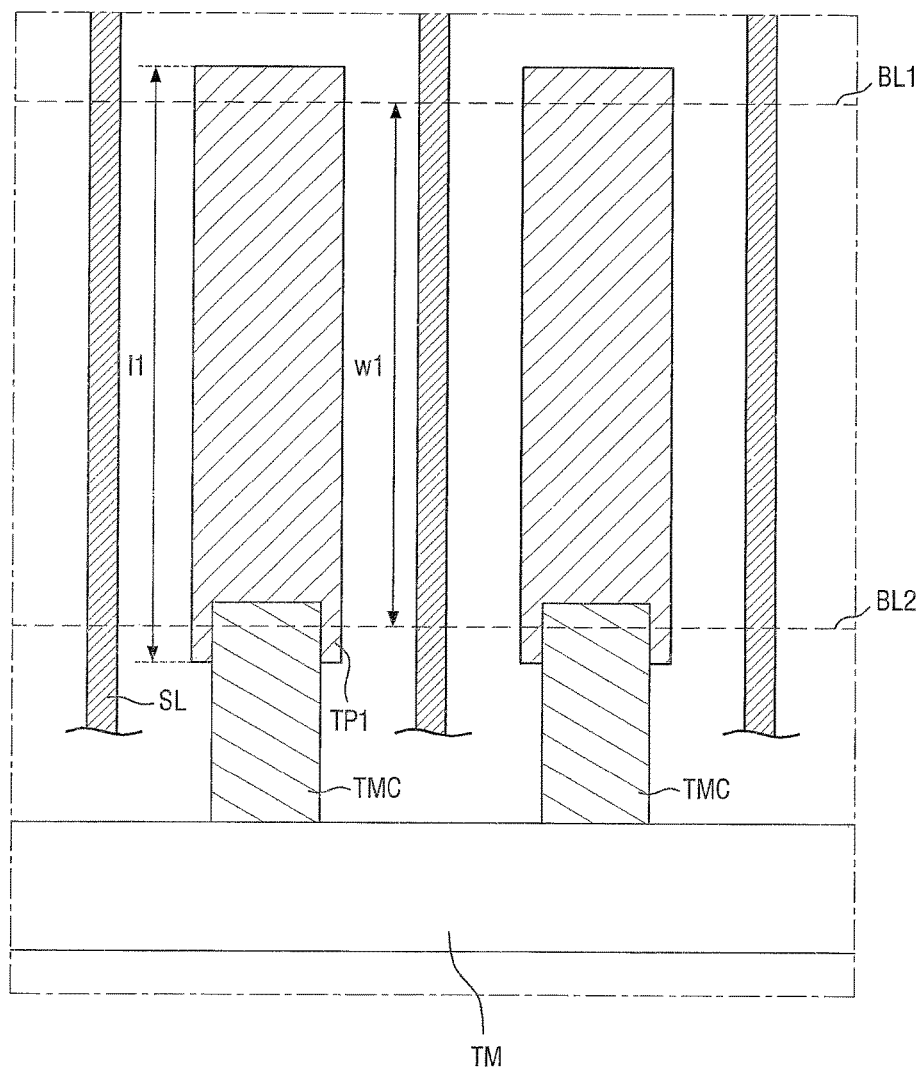
FIG. 11 is a layout view for explaining a method of testing a display device, according to an exemplary embodiment of the present disclosure.

A method of testing a display device, according to an exemplary embodiment of the present disclosure, will hereinafter be described with reference to FIG. 11. In FIGS. 1 through 11, like reference numerals indicate like elements, and thus, descriptions thereof will be omitted or at least simplified.

FIG. 11 is a partial layout view for explaining a method of testing a display device.

Referring to FIG. 11, the method of testing a display device includes: preparing a first substrate 500, which includes a display area DA, a non-display area NDA that is disposed outside the display area DA, a bending area BA that is disposed in the non-display area NDA, signal lines SL that are disposed in the non-display area NDA, and first test patterns TP1); and determining whether the first test patterns TP1 are disconnected.

The first substrate 500 can be substantially the same as its counterparts of the display devices according to the exemplary embodiments of FIGS. 1 through 5, 6, 7, 8 and 9, and 10. Test targets, e.g., the first substrate 500 and a plurality of elements disposed on the first substrate 500, can be substantially the same as their respective counterparts of the display devices according to the exemplary embodiments of FIGS. 1 through 5, 6, 7, 8 and 9, and 10, and thus, detailed descriptions thereof will be omitted.

Thereafter, it can be determined whether the first test patterns TP1 are disconnected.

In an exemplary embodiment, the step of determining whether the first test patterns TP1 are disconnected can be performed by a testing device TM. The testing device TM can include contact terminals TMC. For example, the contact terminals TMC of the testing device TM are placed in contact with the first test patterns TP1. Once the contact terminals TMC are placed in contact with the first test patterns TP1, the testing device TM can determine whether the first test patterns TP1 are disconnected. For example, the testing device TM determines whether the first test patterns TP1 are disconnected by comparing an input resistance with the resistance of the first test patterns TP1, but the present disclosure is not limited to this. For example, a method to determine whether the first test patterns TP1 are disconnected is not particularly limited.

In response to it being determined that the first test patterns TP1 are disconnected, it can be determined whether the signal lines SL adjacent to the first test patterns TP1 are disconnected. For example, it can be determined whether the display device is defective by determining, in an indirect way, whether the signal lines SL are disconnected.

In an exemplary embodiment, it is determined whether the first test patterns TP1 are disconnected, in a state where the first substrate 500 is bent in the bending area BA. For example, by determining whether the first test patterns TP1 are disconnected, in a state where stress is applied to the first test patterns TP1, it can be determined whether the signal lines SL are damaged by the bending of the first substrate 500.

However, the effects of the described technology are not restricted to the one set forth herein. The above and other effects of the described technology will become more apparent to one of daily skill in the art to which the described technology pertains by referencing the claims.

While the inventive technology has been particularly illustrated and described with reference to exemplary embodiments thereof, it will be understood by those of ordinary skill in the art that various changes in form and detail can be made therein without departing from the spirit and scope of the present invention as defined by the following claims. The exemplary embodiments should be considered in a descriptive sense only and not for purposes of limitation.

What is claimed is:

1. A display device, comprising:
   a first substrate including a display area and a non-display area, wherein the non-display area is arranged outside the display area;
   a bending area arranged in the non-display area;
   first and second signal lines arranged in the non-display area; and
   a first test pattern arranged between the first and second signal lines, wherein the first test pattern is configured to determine disconnection.

2. The display device of claim 1, wherein the first substrate is flexible.

3. The display device of claim 1,
   wherein a first bending line and a second bending line are defined where bending of the first substrate begins and ends, and
   wherein the bending area is defined between the first and second bending lines.

4. The display device of claim 1, wherein the first test pattern and the first signal line have substantially the same strength.

5. The display device of claim 1, wherein the first test pattern is formed of the same material as the first signal line.

6. The display device of claim 1, wherein the first test pattern includes a plurality of test patterns.

7. The display device of claim 1, further comprising:
   a plurality of signal lines including the first and second signal lines; and
   a plurality of second test patterns arranged on outer sides of two outermost ones of the signal lines.

8. The display device of claim 1, wherein the first test pattern at least partially overlaps the bending area in a depth dimension of the display device.

9. The display device of claim 8, wherein the bending area has a width that is smaller than a length of the first test pattern.

10. The display device of claim 1, wherein the first signal line and the first test pattern are arranged on the same layer.

11. The display device of claim 1, wherein the first signal line and the first test pattern are arranged on different layers.

12. The display device of claim 1, wherein the first signal line and the first test pattern at least partially overlap each other.

13. The display device of claim 1, wherein each of the first and second signal lines includes first-, second-, and third-layer signal lines.

14. The display device of claim 13,
   wherein the first- and third-layer signal lines are formed of titanium (Ti), and
   wherein the second-layer signal line is formed of aluminum (Al).

15. The display device of claim 1, wherein the first test pattern includes first-, second-, and third-layer test patterns.

16. The display device of claim 15,
   wherein the first- and third-layer test patterns are formed of Ti, and
   wherein the second-layer test pattern is formed of Al.

17. The display device of claim 1, wherein the first test pattern is U-shaped.

18. The display device of claim 1, wherein the first test pattern includes first and second sub-electrodes, which extend in one direction, and a bridge electrode, which connect the first and second sub-electrodes.

19. The display device of claim 18, wherein the bridge electrode is arranged outside the bending area.

20. The display device of claim 18, wherein a portion of the bridge electrode is arranged outside the bending area.

21. A method of testing a display device, comprising:
   preparing a first substrate which includes a display area and a non-display area, wherein the non-display is arranged outside the display area, wherein the non-display area includes a bending area, first and second signal lines, and a test pattern, wherein the test pattern is arranged between the first and second signal lines; and
   determining whether the test pattern is disconnected.

22. The method of claim 21, wherein the determining includes
   i) connecting the test pattern to a testing device and ii) comparing an input resistance with the resistance of the test pattern.

23. The method of claim 22, further comprising determining that
   i) the first and/or second signal line is disconnected when the test pattern is disconnected or
   ii) the first and/or second signal line is connected when the test pattern is connected.

* * * * *